United States Patent
Purwin

(10) Patent No.: US 8,423,695 B2
(45) Date of Patent: Apr. 16, 2013

(54) DUAL PCI-X/PCI-E CARD

(75) Inventor: Charles J. Purwin, Litchfield, NH (US)

(73) Assignee: Broadcom Corporation, Irvine, CA (US)

( * ) Notice: Subject to any disclaimer, the term of this patent is extended or adjusted under 35 U.S.C. 154(b) by 1399 days.

(21) Appl. No.: 11/037,177

(22) Filed: Jan. 19, 2005

(65) Prior Publication Data

US 2006/0161717 A1    Jul. 20, 2006

(51) Int. Cl.
*H05K 7/10*    (2006.01)

(52) U.S. Cl.
USPC .......................................... 710/301; 361/785

(58) Field of Classification Search .................. 710/2, 8, 710/10–11, 62, 300–302, 305; 361/748, 361/785–791
See application file for complete search history.

(56) References Cited

U.S. PATENT DOCUMENTS

| | | | | |
|---|---|---|---|---|
| 4,795,602 | A | * | 1/1989 | Pretchel et al. .......... 264/272.15 |
| 5,169,337 | A | * | 12/1992 | Ortega et al. .................. 439/510 |
| 5,359,728 | A | * | 10/1994 | Rusnack et al. .................. 714/5 |
| 5,391,922 | A |   | 2/1995 | Matsui |
| 5,444,856 | A | * | 8/1995 | Bowers et al. ................. 709/221 |
| 6,036,534 | A | * | 3/2000 | Hoyt et al. ..................... 439/510 |
| 6,142,357 | A | * | 11/2000 | Howell ............................ 228/39 |
| 6,301,121 | B1 | * | 10/2001 | Lin ................................ 361/783 |
| 6,343,007 | B1 | * | 1/2002 | Dubois et al. ................. 361/683 |
| 6,434,157 | B1 | * | 8/2002 | Dube' et al. ................... 370/401 |
| 2004/0143694 | A1 | * | 7/2004 | Chen et al. ..................... 710/309 |
| 2005/0042931 | A1 | * | 2/2005 | Lavie ............................ 439/676 |

FOREIGN PATENT DOCUMENTS

| | | |
|---|---|---|
| DE | 92 11 227 U1 | 12/1992 |
| EP | 0 350 573 | 1/1990 |
| EP | 0 356 757 | 3/1990 |

OTHER PUBLICATIONS

PCI Local Bus Specification. Revision 2.2. Dec. 18, 1998. PCI Special Interest Group. Chapters 1, 4, and 5. Pages ii-xx, 1-19, and 113-178.*

PCI Express Base Specification. Revision 1.0a. Apr. 15, 2003. PCI Special Interest Group. Chapters 1 and 4. pp. 2-37 and 151-220.*

PCI-X Addendum to the PCI Local Bus Specification. Revision 1.0. Sep. 22, 1999. PCI Special Interest Group. Chapters 1, 6, and 9. pp. 2-34, 127-134, and 181-198.*

'cache' in The Free On-Line Dictionary of Computing. Online Jun. 25, 1997. Retrieved from Internet Sep. 20, 2006. <http://foldoc.org/foldoc.cgi?query=cache>.*

"The American Heritage College Dictionary", Fourth Edition. 2002. Houghton Mifflin Company. Entry 'central'. p. 234. ISBN 0-618-09848-8.*

'port' in "The Microsoft Press Computer Dictionary". Second Edition. 1994. Microsoft Press. p. 309. ISBN 1-55615-597-2.*

(Continued)

*Primary Examiner* — Thomas J Cleary

(74) *Attorney, Agent, or Firm* — Sterne, Kessler, Goldstein & Fox P.L.L.C.

(57) ABSTRACT

A dual bus interface PCB includes a main chipset component, a first type bus interface connector, and a second type bus interface connector. The PCB can be configured at fabrication time to enable a variety of configurations for operation. Optionally, the PCB can also be provided at least one memory chip and a NIC (Network Interface Card) chip. By virtue of having a dual interface, the PCB can be used with either the first type or the second type bus. Furthermore, the dual interface PCB eliminates the need by chipset manufacturers to carry multiple PCB variations of the same product in order to support various bus interfaces. In one embodiment, the PCB is a dual PCI-X/PCI-E interface PCB.

21 Claims, 10 Drawing Sheets

OTHER PUBLICATIONS

"Adaptor Card for Personal Computer", IBM Technical Disclosure Bulletin, IBM Corp., Oct. 1, 1988, vol. 31, No. 5, IBM Corp, New York, NY.

European Search Report, issued in EP Appl. No. 05026023.1, issued Mar. 24, 2006, (3 pages).

* cited by examiner

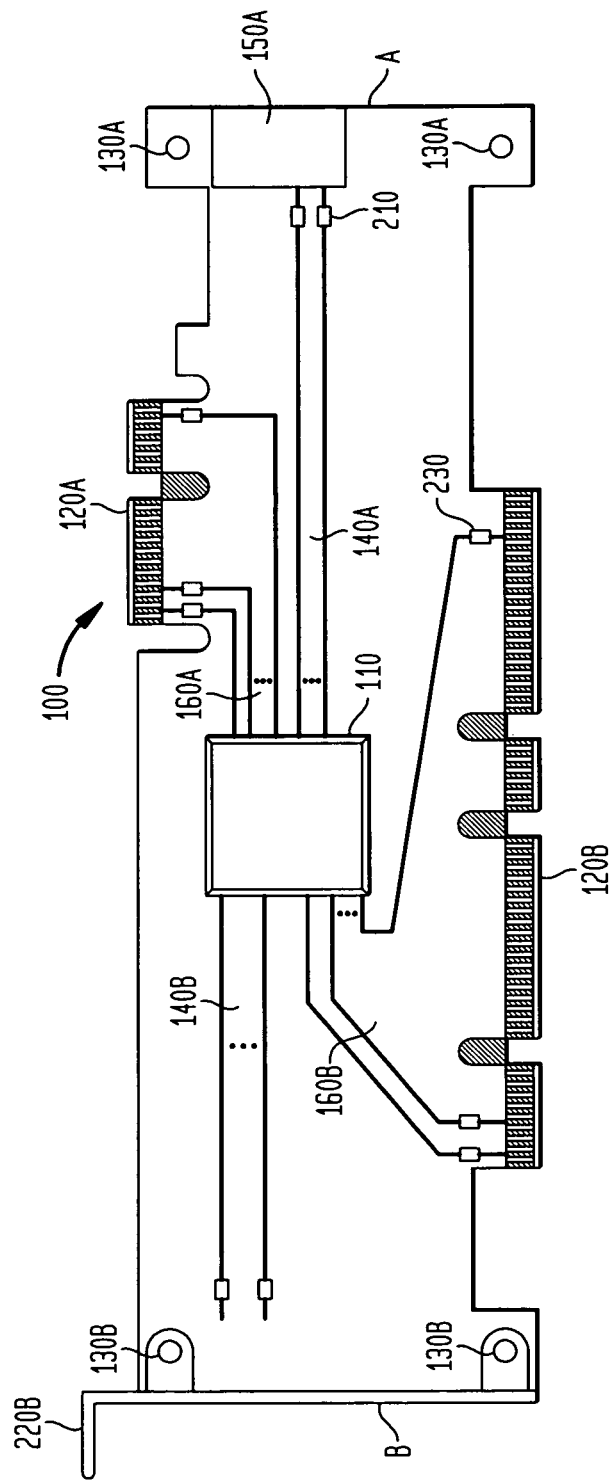

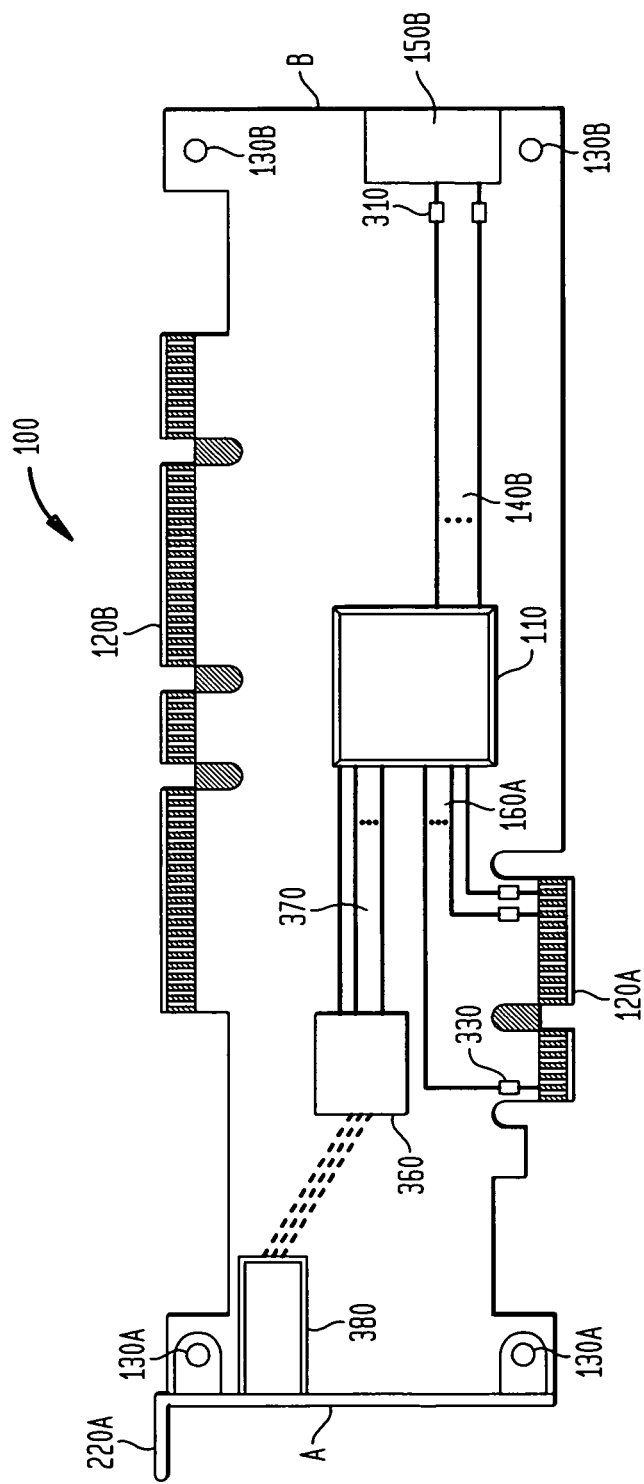

DUAL PCI-X/PCI-E CARD

BACKGROUND OF THE INVENTION

1. Field of the Invention

The invention herein relates in general to a dual bus interface printed circuit board (PCB) and more particularly to a PCB provided with both a PCI-X (Peripheral Component Interconnect-Extended) bus interface and a PCI-E (Peripheral Component Interconnect-Express) bus interface.

2. Background Art

In the field of I/O Interconnect, PCI (Peripheral Component Interconnect) is a widely adopted I/O bus standard in a wide variety of computer platforms. To meet the growing demand for bandwidth by new applications, PCI has gone through several changes in the last decade leading to extension standards such as PCI-2.2 and PCI-X (PCI-Extended). These extension standards however are all built on the same architecture, protocols, signals, and connector as the conventional PCI, the reuse having been mainly supported by the combination of backward compatibility and the ease of migration from the conventional PCI to the newer standards.

The conventional PCI architecture is based on a multi-drop, parallel bus implementation, with one local bus being shared by multiple peripheral devices to communicate with the central processing unit (CPU). When first developed, the PCI architecture solved some of the limitations of the previous bus standards such as ISA (Industry Standard Architecture) and EISA (Extended ISA), by allowing direct access of peripheral devices to the CPU. However, with the exponential growth of CPU power, bus technology based on the conventional PCI architecture is becoming more and more a bottleneck to enhanced system performance. The main reason for that being that a shared bus technology suffers from a scalability problem, limiting the number of peripherals that can be efficiently supported by a system.

At its current state, the conventional PCI bus technology is theoretically very close to its practical limits, with only minor performance gains possible at large costs in form factor. It is for this reason therefore that the conventional PCI architecture is slowly giving way to a new standard known as the PCI-E (PCI-Express) standard.

The PCI-E architecture is based on a series of point-to-point connections, with each connection employing a packet-based transfer scheme and supporting bidirectional communication. To meet the varying bandwidth needs of different system components, PCI-E can be easily scaled from one to 32 lanes, with a single lane providing 250 MB/sec of dedicated bandwidth in each direction. In addition to providing ample bandwidth, PCI-E also supports advanced power management, hot plugging, and its packet-based transfer protocol allows for time dependent data delivery and quality of service arbitration for high priority data streams.

Although PCI-E clearly provides major performance improvements compared to the conventional PCI standard and its extensions (parallel PCI), serial PCI-E is not backward compatible with parallel PCI, and the shift from parallel PCI to PCI-E is likely to be a slow one. It is expected that parallel PCI will coexist in many platforms with PCI-E to support today's lower bandwidth applications, until a compelling need, such as a new form factor, causes a full migration to fully PCI-E systems.

Foreseeing the coexistence of PCI and PCI-E in future platforms, chip makers have been designing dual PCI-X/PCI-E chipsets that can be operated with either of the two bus standards.

Currently available PCBs, however, are designed for use with only a single bus standard, providing a single bus connector per card. As a result, dual bus chipsets have to be mounted on multiple PCB variations to support the various bus interface types, denying the user the interface duality of the chipset component, and running higher fabrication costs to chipset manufacturers.

The likely coexistence of the PCI-X and the PCI-E bus standards in future computer platforms necessitates efficient solutions to ensure the interoperability of the two. As PCI-E is not backward compatible with the conventional PCI standard, of which PCI-X is an extension, chipset manufacturers currently resort to carrying multiple PCB variations of the same product in order to support various bus interfaces. This solution is clearly a costly and inefficient one from a fabrication process point of view.

What is needed therefore is a dual interface PCB card that provides both PCI-X and PCI-E functionality.

BRIEF SUMMARY OF THE INVENTION

The present invention is directed to a PCB having multiple different bus interface connectors, and a chipset that supports the multiple bus interfaces. In an embodiment, the present invention includes a dual PCI-X/PCI-E interface PCB. As a result, the dual interface functionality of a PCI-X/PCI-E chipset can be fully taken advantage of by the user, operating the chipset on either a PCI-X or a PCI-E bus. Furthermore, chipset fabrication costs can be reduced as well as the fabrication process simplified, by the production of a single dual bus interface PCB instead of multiple board variations to support various bus interface types.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2A is a top view diagram of the dual-interface PCB 100 in a PCI-X configuration.

FIG. 3C is another top view diagram of the dual-interface PCB 100 in a PCI-E configuration.

The present invention will be described with reference to the accompanying drawings. The drawing in which an element first appears is typically indicated by the leftmost digit(s) in the corresponding reference number.

DETAILED DESCRIPTION OF THE INVENTION

Overview

Figure 1A:
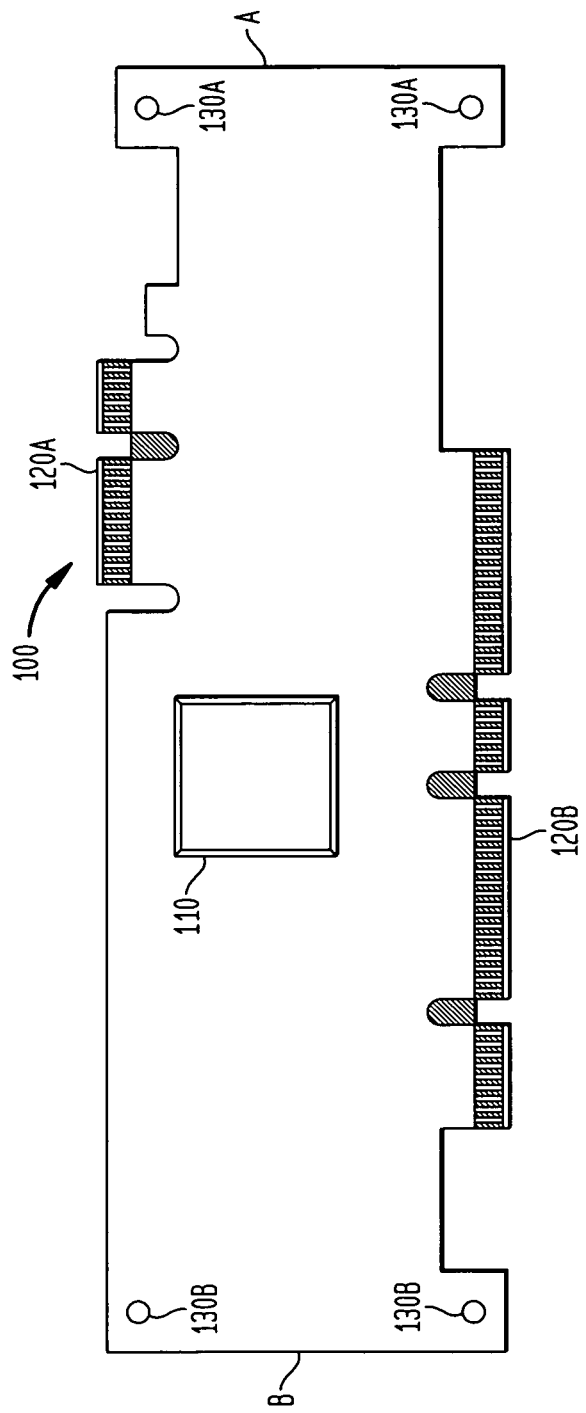
FIG. 1A is a top view diagram of a dual-interface PCB 100.

FIG. 1A shows a top view of an example dual-interface PCB 100 according to the present invention. In the example, the PCB 100 includes a main chipset 110, a first interface connector 120A, a second interface connector 120B, and two pairs of screw holes 130A and 130B located on edges A and B of the PCB 100, respectively. The main chipset 110 is an electronic chipset that supports two different types of bus interfaces. The two pairs of screw holes 130A and 130B allow the PCB 100 to be attached to a computer case from either edge A or edge B. Other attachment mechanisms can also be employed.

In the example of FIG. 1A, the interface connectors 120A and 120B are illustrated at opposite edges of the PCB 100. The invention is not, however, limited to this example. Based on the description herein, one skilled in the relevant art(s) will understand that connectors 120A and 120B can be positioned on adjacent edges or on the same edge of PCB 100.

Figure 1B:
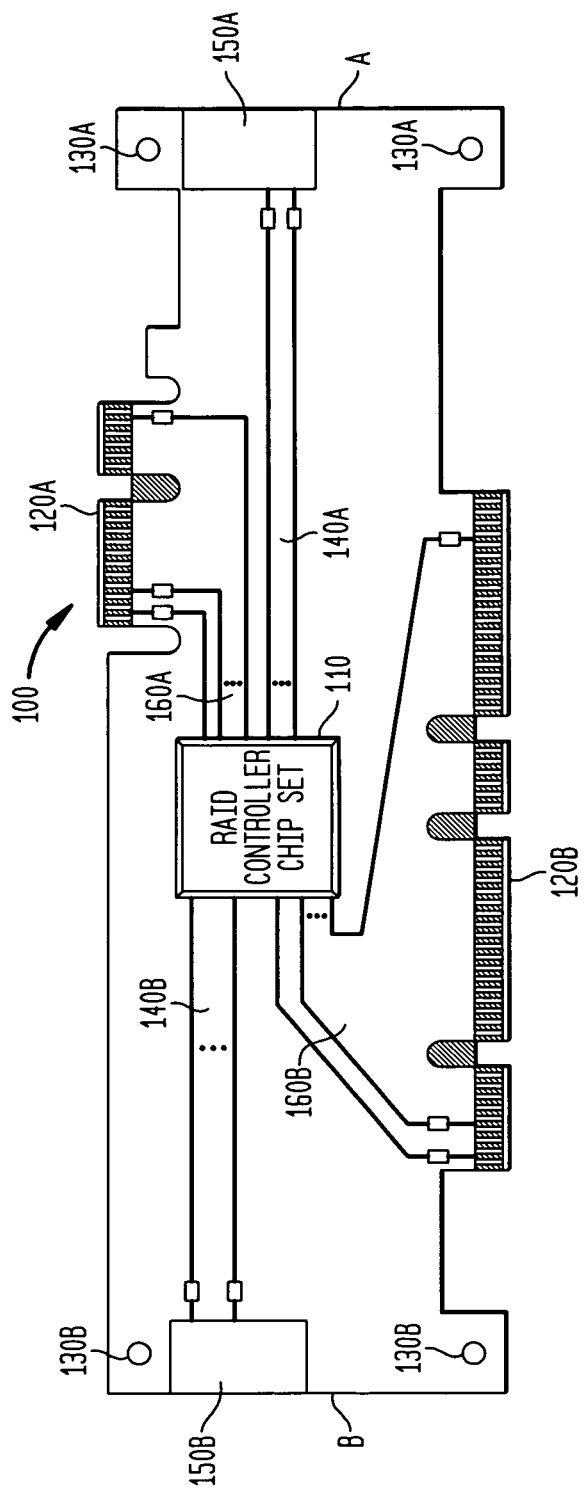
FIG. 1B is another top view diagram of the dual-interface PCB 100.

In another example embodiment, shown in FIG. 1B, the main chipset 110 is a RAID (Redundant Arrays of Inexpensive Disks) controller chipset. The interface connector 120A is a PCI-E bus interface connector. The interface connector 120B is a PCI-X bus interface connector. Connector ports 150A and 150B are placed on edge A and edge B of the PCB, respectively. The connector ports 150A and 150B are used to interface the RAID controller chipset 110 to an array of disk drives (not shown in the diagram). Signal traces 140A and 160A are routed from the main chipset 110 toward edge A of the PCB and interface connector 120A, respectively. Similarly, signal traces 140B and 160B are routed from the main chipset 110 toward edge B of the PCB and interface connector 120B, respectively. Surface mount/through hole resistors can be mounted at the main chipset's ends of signal traces 140A, 140B, 160A, and 160B to connect the main chipset 110 to connector ports 150A, connector ports 150B, interface connector, 120A, and interface connector 120B, respectively. In the exemplary embodiment shown, the PCB 100 is configured such that the interface connector 120B and connector ports 150A are enabled.

In the example of FIG. 1B, connector ports 150A and 150B are illustrated on opposite edges of the PCB 100. The invention is not, however, limited to this example. Based on the description herein, one skilled in the relevant art(s) will understand that connector ports 150A and 150B can be positioned on adjacent edges or on a surface of PCB 100.

In an embodiment, connector ports 150A or 150B are optionally attached to the PCB at the end of the fabrication process. The PCB configuration would have been determined then, and connector ports 150A or 150B would be attached as necessary. In another embodiment, each of connector ports 150A and 150B include a set of 8 SATA/SAS (Serial Advanced Technology Attachment/Serial Attached SCSI) connector ports.

FIG. 2A shows a top view of the dual-interface PCB 100 in a PCI-X configuration. Surface mount/through hole resistors 210 are mounted at the main chipset's ends of signal traces 140A to connect the main chipset 110 to connector ports 150A. Similarly, surface mount/through hole resistors 230 are mounted at the main chipset's ends of signal traces 160B to connect the main chipset 110 to PCI-X interface connector 120B.

A mounting bracket 220B is attached to edge B of the PCB. The bracket 220B allows the PCB to be fixed from edge B to a computer system's case, such that PCI-X connector 120B can be inserted into a matching PCI-X slot on the computer system's motherboard.

In this example of FIG. 2A, the PCI-E interface connector 120A is not enabled, and no connector ports 150B are placed on edge B of the PCB. Signal traces 140B and 160A however are still laid out on the PCB.

Figure 2B:
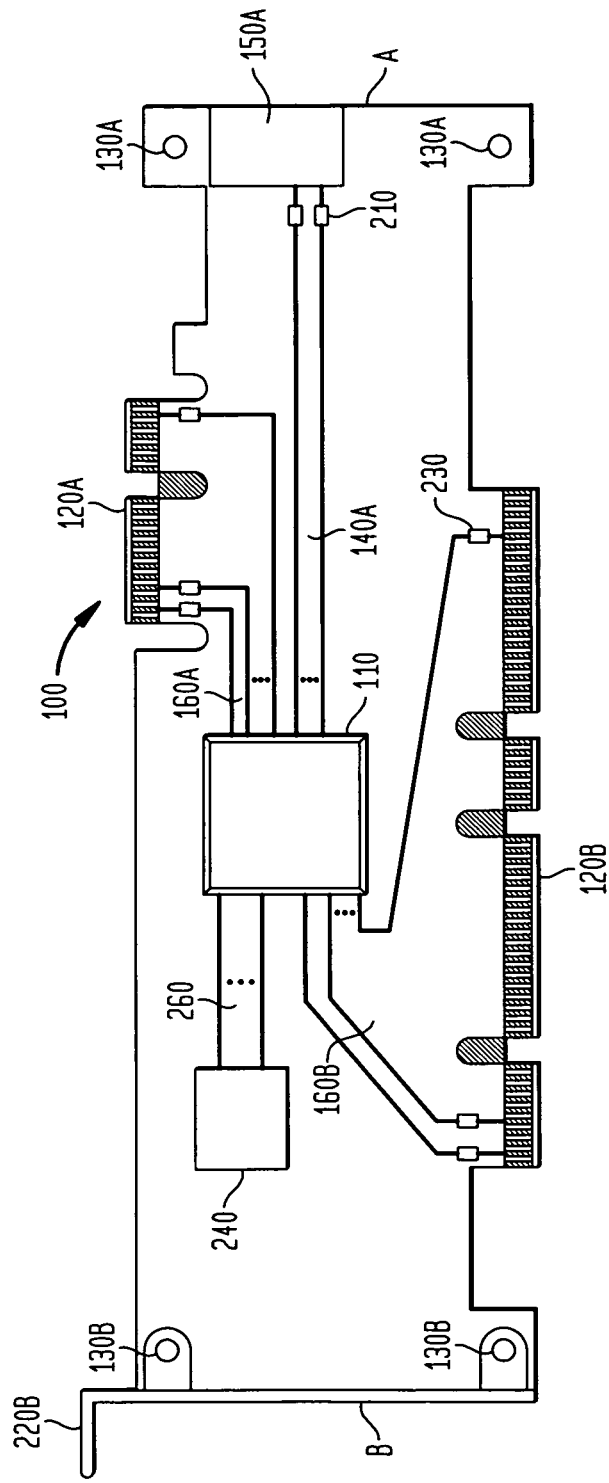
FIG. 2B is another top view diagram of the dual-interface PCB 100 in a PCI-X configuration.

FIG. 2B shows another top view of the dual-interface PCB 100 in a PCI-X configuration. For ease of illustration, signal traces 140B are omitted from the drawing. A cache memory chip 240 is optionally provided on board the PCB 100. Signal traces 260 connect the main chipset 110 to the memory chip 240. The memory chip 240 serves to improve the performance of the main chipset 110, by providing it quick access to a nearby memory cache. While a single memory chip 240 is shown in the diagram, it should be obvious to one skilled in the art that additional memory chips can also be used in this and/or other embodiments of the PCB 100.

Figure 3A:
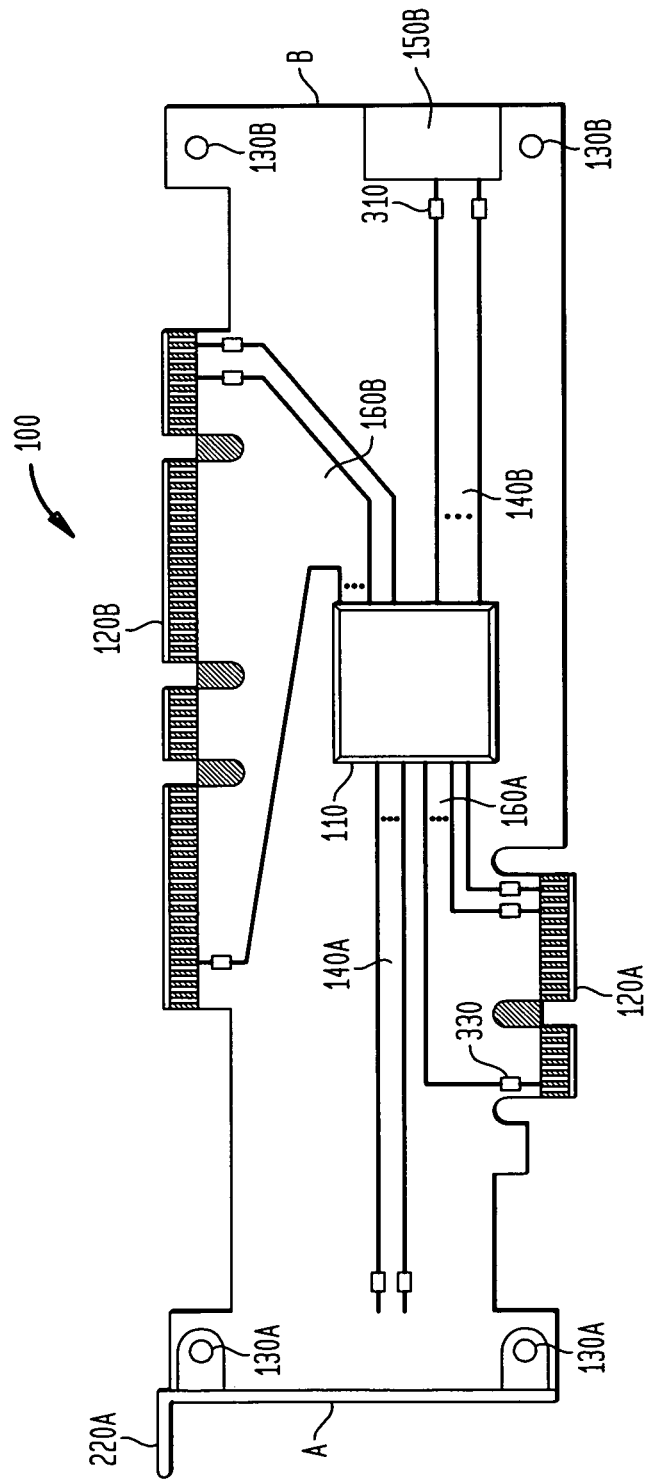
FIG. 3A is a top view diagram of the dual-interface PCB 100 in a PCI-E configuration.

FIG. 3A shows a top view of the dual-interface PCB 100 in a PCI-E configuration. In the embodiment, surface mount/through hole resistors 310 are mounted at the main chipset's ends of signal traces 140B to connect the main chipset 110 to connector ports 150B. Similarly, surface mount/through hole resistors 330 are mounted at the main chipset's ends of signal traces 160A to connect the main chipset 110 to PCI-X interface connector 120A. A mounting bracket 220A is attached to edge A of the PCB 100. The bracket 220A allows the PCB to be fixed from edge A to a computer system's case, such that the PCI-E connector 120A can be inserted into a matching PCI-E slot on the computer system's motherboard. In this exemplary embodiment, the PCI-X interface connector 120B is not enabled, and no connector ports 150A are placed on edge A of the PCB. Signal traces 140A and 160B however are still laid out on the PCB.

Figure 3B:
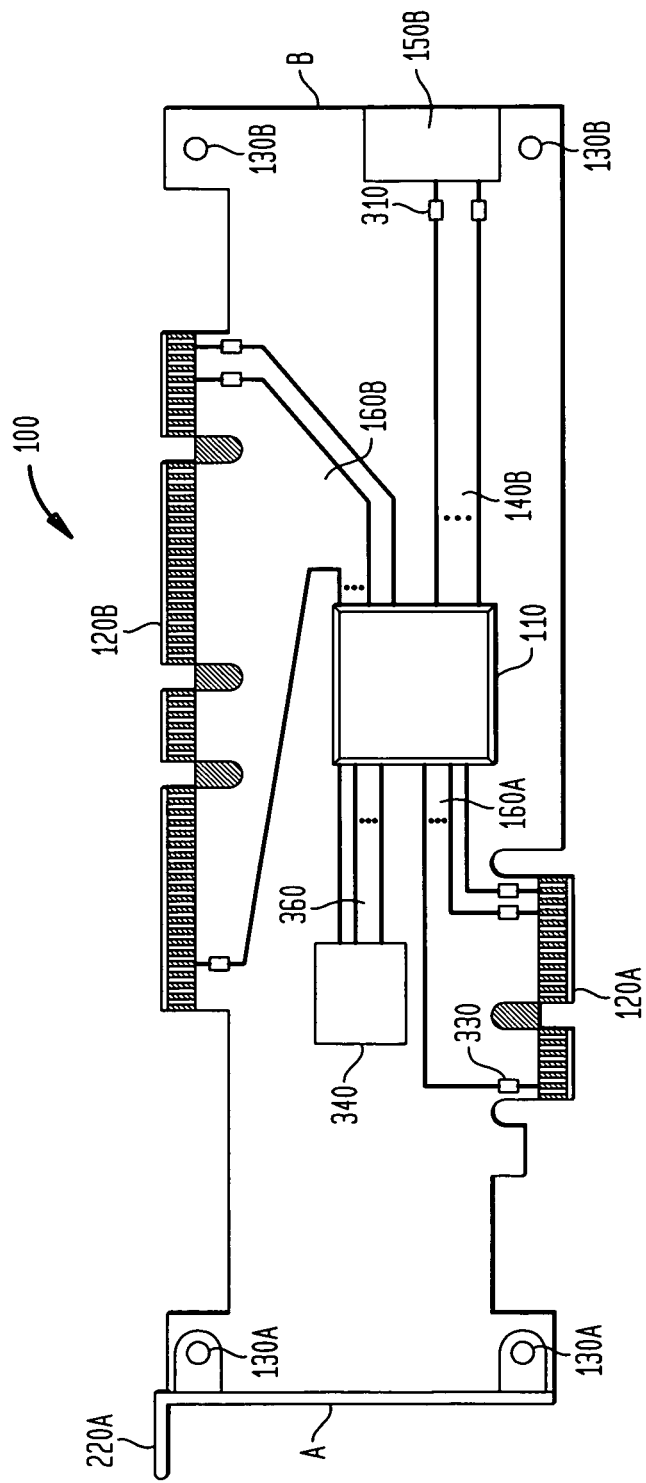
FIG. 3B is another top view diagram of the dual-interface PCB 100 in a PCI-E configuration.

FIG. 3B shows another top view of the dual-interface PCB 100 in a PCI-E configuration. For ease of illustration, signal traces 140A are omitted from the drawing. In this embodiment, a cache memory chip 340 is optionally provided on board the PCB 100. Signal traces 360 connect the main chipset 110 to the memory chip 340. The memory chip 340 serves to improve the performance of the main chipset 110, by providing it quick access to a nearby memory cache. While a single memory chip 340 is shown in the diagram, it should be obvious to one skilled in the art that additional memory chips can also be used in this and/or other embodiments of the PCB 100.

FIG. 3C shows another top view of the dual-interface PCB 100 in a PCI-E configuration. In this embodiment, a NIC (Network Interface Card) chip 360 is provided on the PCB 100. Signal traces 370 are routed from the main chipset 110 to the NIC chip 360. An Ethernet connector 380 is attached onto edge B of the PCB 100. The connector 380 can be, for example, an RJ45 connector. Signal traces 140A and 160B are omitted from the drawing for convenience.

Figure 3D:
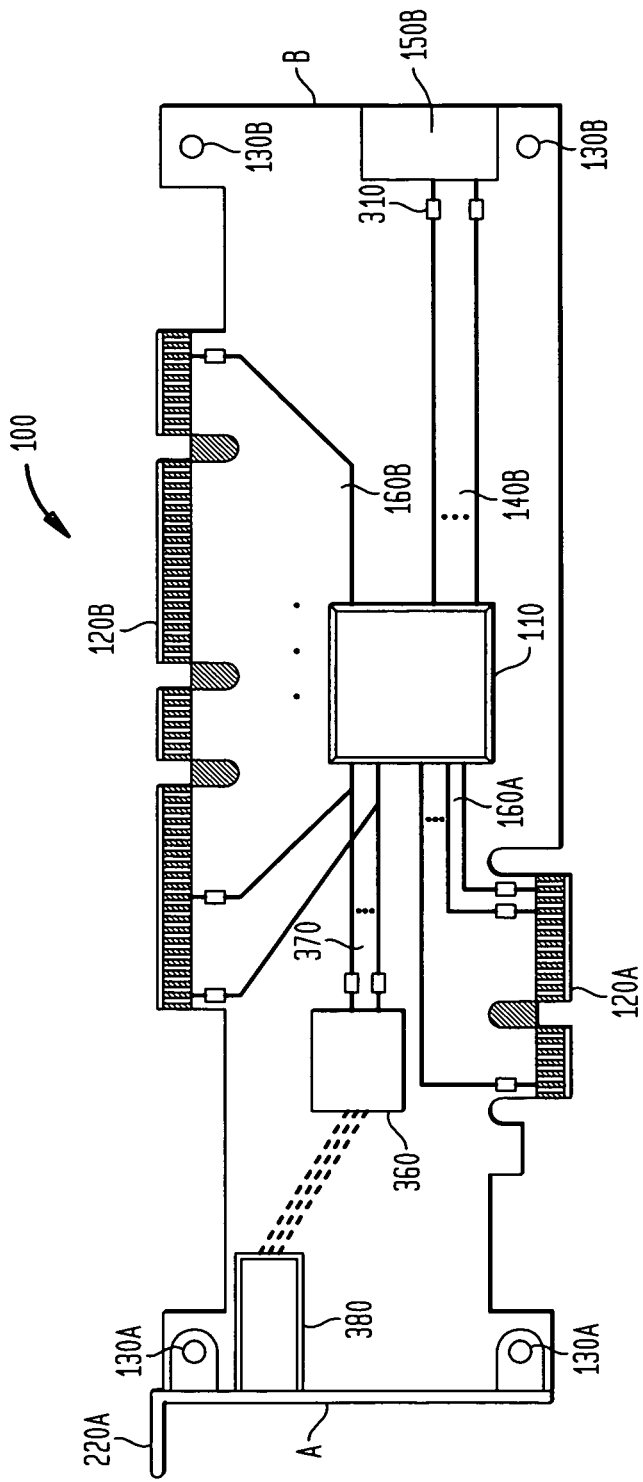
FIG. 3D is another top view diagram of the dual-interface PCB 100 in a PCI-E configuration.

FIG. 3D is another top view of the dual-interface PCB 100 in a PCI-E configuration. In this embodiment, depending on the number of I/O pins provided on the main chipset 110, the PCI-X interface connector 120B and/or the NIC chip 360 can be enabled. Some of the I/O pins of the main chipset 110 can be configured to be used by either the interface connector 120B or the NIC chip 360. The selection of a configuration is optionally made at fabrication time through the use of surface mount/through hole resistors to enable selected traces on the PCB 100. FIG. 3D shows a configuration wherein signal traces 370 are enabled but signal traces 160B are not, resulting in a connected NIC chip 360 but a disconnected PCI-X bus interface 120B.

Figure 4:
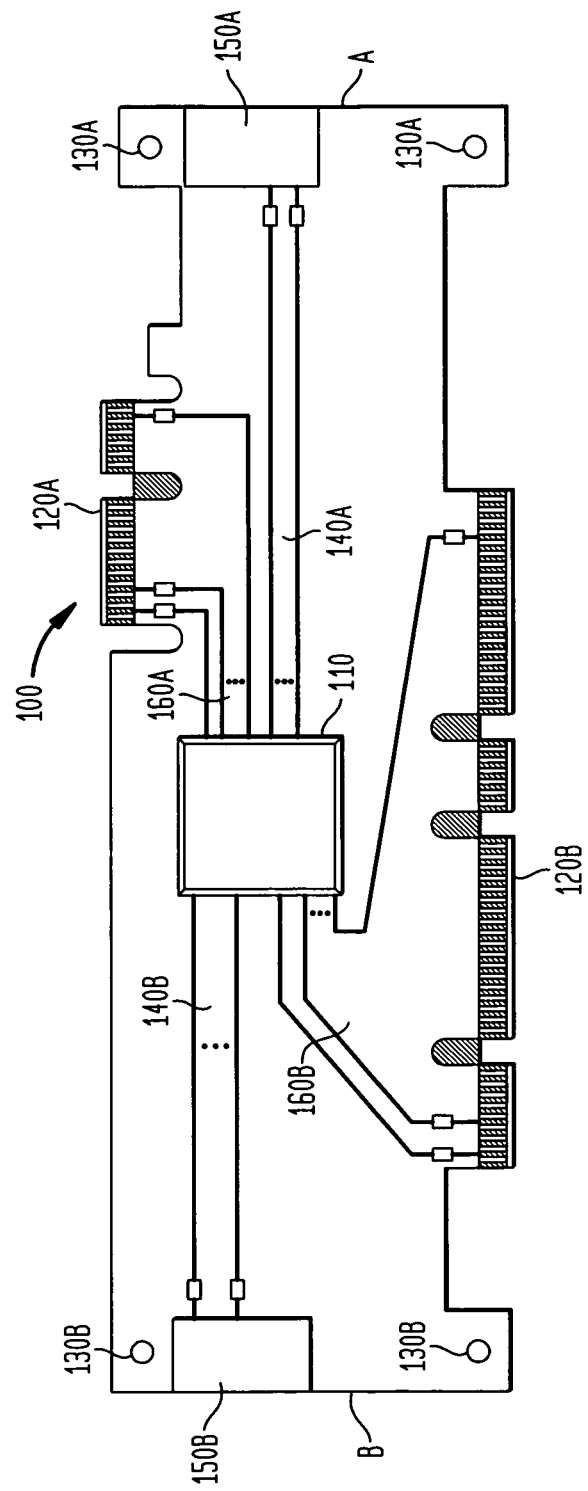
FIG. 4 is another top view diagram of the dual-interface PCB 100.

In FIG. 4, signal traces 140A, 140B, 160A, and 160B are all enabled. As a result, in this configuration, both interface connectors 120A and 120B, as well as connector ports 150A and 150B, are operational. No mounting bracket is shown in FIG. 4, but one can be attached to edge A and/or B of the PCB 100.

The PCB 100 can be used with either a PCI-X or a PCI-E bus interface. The switching from using one interface to using the other is achieved by transferring the mounting bracket from one edge to the other, rotating the PCB 180° degrees, and plugging the desired bus interface connector into a matching bus slot on the computer system's motherboard.

Figure 5:
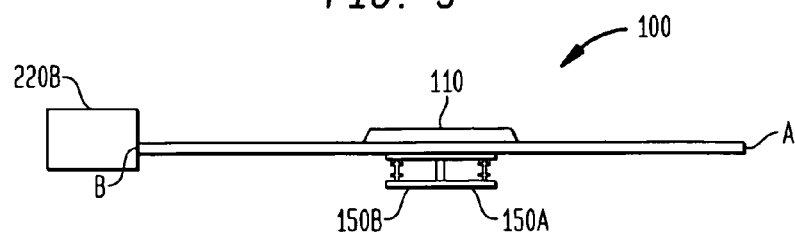
FIG. 5 is a side view diagram of the dual-interface PCB 100.

FIG. 5 shows a side view of the dual-interface PCB 100. In this embodiment, connector ports 150A and 150B are attached centrally onto a surface of the PCB 100, instead of being placed on opposite edges A and B. The configuration frees area of the PCB 100, while still allowing an easy attachment of a matching cable at connector ports 150A and/or 150B. In the exemplary embodiment shown in FIG. 5, the PCB 100 is ready for use in a PCI-X configuration with the mounting brackets 220B attached to edge B of the PCB. Connector ports 150A would be used in this configuration.

Figure 6:
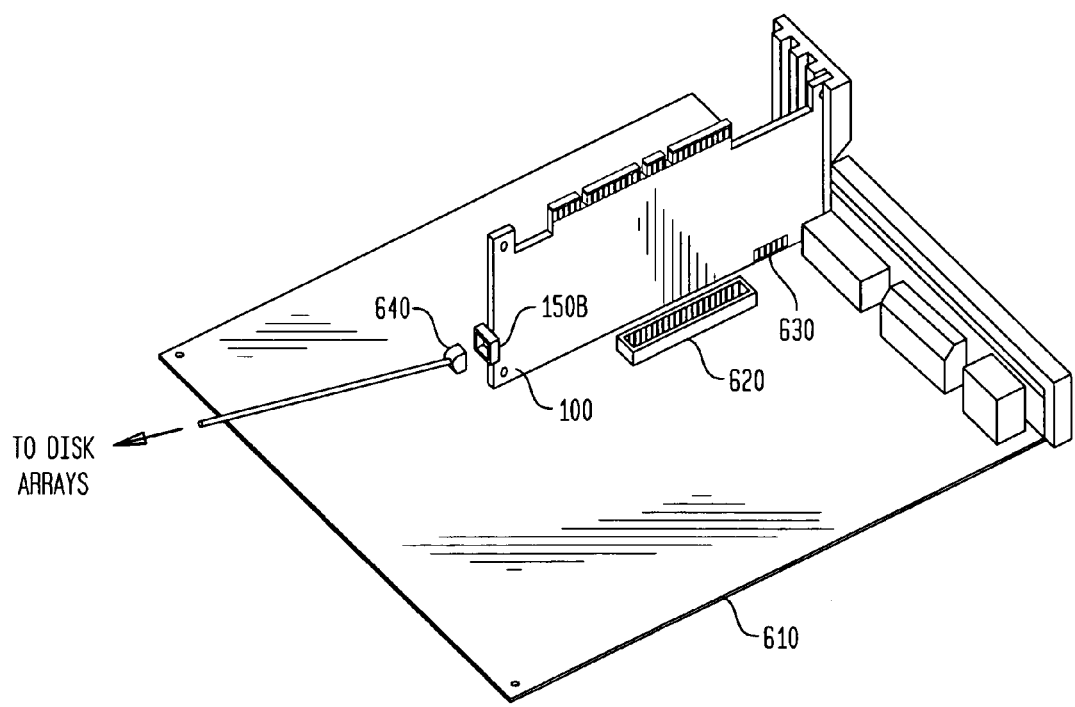
FIG. 6 is a 3D view diagram of the dual-interface PCB 100.

FIG. 6 shows a 3D view of the dual-interface PCB 100 mounted onto a motherboard 610 of a computer system. The motherboard 610 is shown provided with both a PCI-X bus slot 620 and a PCI-E bus slot 630. The PCB 100 is shown used in the PCI-E configuration with the PCI-E bus connector 120A connected to the PCI-E slot 630. Connector ports 150B are shown connected to matching SATA/SAS cables, also connected to the array of disk drives.

The present invention puts forward a novel solution in the form of a dual interface PCB. The dual interface PCB of the current invention is easily configurable at fabrication time, and can support a number of different variations.

While the invention is described herein in view of a dual PCI-X/PCI-E interface PCB, the scope of the invention should not be limited by the type of interfaces supported by the PCB. It also should be noted that the PCB layouts provided in the accompanying drawings have been presented by way of example only, and not limitation.

Conclusion

While specific configurations and arrangements are discussed, it should be understood that this is done for illustrative purposes only.

A person skilled in the pertinent art will recognize that other configurations and arrangements can be used without departing from the spirit and scope of the present invention. It will be apparent to a person skilled in the pertinent art that this invention can also be employed in a variety of other applications.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A circuit board assembly, comprising:
a circuit board;
a first bus interface connector mounted to the circuit board, the first bus interface connector configured for a Peripheral Component Interconnect-Extended (PCI-X) interface protocol;
a second bus interface connector mounted to the circuit board, the second bus interface configured for a Peripheral Component Interconnect-Express (PCI-E) interface protocol;
an integrated circuit chip or chip set mounted to a first surface of the circuit board and configured to interface with at least one of the first and second bus interface connectors;
a first set of connector ports selectively coupled to the chip or chip set when the first bus interface connector is enabled; and
a second set of connector ports selectively coupled to the chip or chip set when the second bus interface connector is enabled;
wherein the first and second sets of connector ports are mounted centrally onto a second surface of the circuit board, opposite to the first surface; and
wherein the circuit board is insertable into a motherboard by selectively inserting either the first or the second bus interface connector into a corresponding slot of the motherboard.

2. The circuit board assembly of claim 1, wherein the chip or chip set supports more than one bus interface.

3. The circuit board assembly of claim 1, wherein the first bus interface connector and the second bus interface connector are located on opposite edges of the circuit board.

4. The circuit board assembly of claim 1, wherein the circuit board is configured at fabrication time to enable the first bus interface connector, the second bus interface connector, or both.

5. The circuit board assembly of claim 4, further comprising:
a first set of signal traces routed from the chip or chip set to the first bus interface connector; and
a second set of signal traces routed from the chip set to the second bus interface connector.

6. The circuit board assembly of claim 4, wherein the chip or chip set comprises a RAID controller.

7. The circuit board assembly of claim 6, wherein the first set of connector ports or the second set of connector ports are used to connect the RAID controller to an array of disk drives.

8. The circuit board assembly of claim 7, wherein the first set of connector ports and the second set of connector ports comprise SATA/SAS connector ports.

9. The circuit board assembly of claim 4, wherein the first bus interface connector comprises a PCI-X bus interface connector, and the second bus interface connector comprises a PCI-E bus interface connector.

10. The circuit board assembly of claim 4, wherein the first bus interface connector is enabled, and the second bus interface connector is not enabled.

11. The circuit board assembly of claim 10, further comprising:
a memory chip mounted to the circuit board, and coupled to the chip or chip set,
wherein the memory chip provides a memory cache for the chip or chip set.

12. The circuit board assembly of claim 10, further comprising:

a NIC (Network Interface Card) chip mounted to the circuit board, and coupled to the chip or chip set; and an Ethernet connector mounted to the circuit board, and coupled to the NIC chip.

13. The circuit board assembly of claim 1, wherein the first set of connector ports is used when the chip set is operated using the PCI-X interface protocol, and the second set of connector ports is used when the chip set is operated using the PCI-E interface protocol.

14. The circuit board assembly of claim 1, wherein the first bus interface connector and the second bus interface connector are both enabled.

15. The circuit board assembly of claim 14, wherein the circuit board can be used with either the PCI-X interface protocol or the PCI-E interface protocol, when bus slots of the first and second interface types are available on the system whereon the circuit board is being attached.

16. The circuit board assembly of claim 15, wherein a selection between using the circuit board with the PCI-X interface protocol to using the circuit board with the PCI-E interface protocol or vice versa, is made by a 180° degrees rotation of the circuit board with respect to a horizontal axis perpendicular to said first surface of the circuit board when the circuit board is inserted vertically into said motherboard resting in a horizontal plane, and with respect to a vertical axis perpendicular to said first surface of the circuit board when the circuit board is inserted horizontally into said motherboard resting in a vertical plane.

17. A method of fabricating a dual bus interface circuit board, comprising:

mounting a chip or chipset on the circuit board;

mounting a first bus interface connector and a second bus interface connector to the circuit board, wherein the first bus interface connector comprises a Peripheral Component Interconnect-Extended (PCI-X) connector and the second bus interface connector comprises a Peripheral Component Interconnect-Express (PCI-E) connector;

routing a first set and a second set of signal traces from the chip or chipset to the first and second bus interface connectors, respectively;

selectively mounting resistors at first ends of one or more of the first and the second sets of signal traces to selectively enable one or more of the first and second bus interface connectors;

coupling a first set of connector ports to the chip or chipset when the first bus interface connector is enabled; and coupling a second set of connector ports to the chip or chipset when the second bus interface connector is enabled;

wherein the circuit board is insertable into a motherboard by selectively inserting either the first or the second bus interface connector into a corresponding slot of the motherboard.

18. The method of claim 17, wherein the chip or chip set comprises a RAID (Redundant Array of Inexpensive Disks) controller chipset.

19. The method of claim 17, wherein each of the first set and second set of connector ports comprise 8 SATA/SAS connector ports.

20. The method of claim 17, wherein both the first and the second bus interface connectors are enabled, further comprising:

attaching said first set of connector ports and said second set of connector ports onto a second surface of the circuit board, wherein the chip or chipset is mounted on a first surface of the circuit board opposite to said second surface.

21. The method of claim 17, further comprising:

drilling a screw hole at every corner of the circuit board, thereby allowing a mounting bracket to be attached at either edge of the circuit board.

* * * * *